United States Patent
Chang et al.

[11] Patent Number: 5,899,751
[45] Date of Patent: May 4, 1999

[54] METHOD FOR FORMING A PLANARIZED DIELECTRIC LAYER

[75] Inventors: Ting-Chang Chang; Yu-Jane Mei, both of Hsinchu, Taiwan

[73] Assignee: United Microelectronics Corp., Hsin-Chu, Taiwan

[21] Appl. No.: 08/998,601

[22] Filed: Dec. 29, 1997

[30] Foreign Application Priority Data

Oct. 18, 1997 [TW] Taiwan ................................ 86115354

[51] Int. Cl.⁶ .................................................. H01L 21/44
[52] U.S. Cl. ........................ 438/758; 438/758; 438/623; 438/624; 257/759; 257/760
[58] Field of Search ................................. 438/623, 758, 438/624, 778–780, 760–761; 257/759, 760

[56] References Cited

U.S. PATENT DOCUMENTS

| | | | |
|---|---|---|---|
| 5,145,723 | 9/1992 | Ballance et al. | 427/397.7 |
| 5,306,947 | 4/1994 | Adachi et al. | 257/642 |
| 5,496,776 | 3/1996 | Chien et al. | 438/624 |
| 5,506,177 | 4/1996 | Kishimoto et al. | 438/624 |
| 5,530,293 | 6/1996 | Cohen et al. | 257/752 |
| 5,607,773 | 3/1997 | Ahlburn et al. | 428/427 |
| 5,693,565 | 12/1997 | Camilletti et al. | 1/1 |

*Primary Examiner*—Charles Bowers
*Assistant Examiner*—Thanh Nguyen
*Attorney, Agent, or Firm*—Rabin & Champagne P.C.

[57] ABSTRACT

A method for forming a planarized dielectric layer comprising the steps of first dissolving hydrogen silsesquoxane (HSQ) in a solvent to form a solution, then spreading the solution over a silicon substrate. Next, the solvent is allowed to evaporate, and then heated-treated using a temperature of between 150° C. to 400° C. to form a silica-coated dielectric layer. Finally, a fluoride implant treatment (FIT) is performed to create a dielectric layer having a better thermal stability, more stable dielectric constant and a lower leakage current.

30 Claims, 1 Drawing Sheet

METHOD FOR FORMING A PLANARIZED DIELECTRIC LAYER

BACKGROUND OF THE INVENTION

1. Field of Invention

The present invention relates to a method for forming a planarized dielectric layer. More particularly, the present invention relates to a method of forming a planarized dielectric layer such as a flowable oxide layer over a device substrate, and then treating the dielectric layer using a fluoride implant treatment so that the dielectric layer has a more stable dielectric constant and a lower leakage current, thereby improving its electrical properties.

2. Description of Related Art

In U.S. Pat. No. 4,756,977 by Haluska et al., a method of forming a silica dielectric layer over a device substrate is proposed. The method is to dissolve hydrogen silsesquioxane (HSQ) in a solvent to form a solution, and then the solution is spread over the electronic devices. Next, the solution is allowed to evaporate. Then, the substrate is heat-treated using a temperature of between 150° C. to 1000° C., thus forming a silica coating on top. The processing just ends there without mentioned anything about subsequent treatments.

In U.S. Pat. No. 5,441,765 by David S. et al., subsequent treatments of the dielectric layer formed by the aforementioned method are further described. In the patent, after the heat treatment of the substrate, the substrate is placed in a chamber exposed to a mixture containing gaseous hydrogen and an inert gas. For example, the inert gas is nitrogen, and the ratio of gaseous hydrogen to nitrogen, that is, $H_2:N_2$ is about 10~15%:90~85%. Thereafter, the dielectric layer is annealed to lower its dielectric constant. However, nothing is mentioned about how to improve other electrical properties.

As the manufacturing of electronic devices is moving to the deep sub-micron regime, any dielectric film must have a narrow gap-filling capability in order to obtain a better planarization. Furthermore, the dielectric film must have good electrical properties such as a thermally stable dielectric constant and a low leakage current.

In light of the foregoing, there is a need in the art to provide an improved method of forming a planarized dielectric layer.

SUMMARY OF THE INVENTION

Accordingly, the present invention is directed to provide a method for forming a planarized dielectric layer using a fluoride implant treatment so that better electrical properties are obtained.

To achieve these and other advantages and in accordance with the purpose of the invention, as embodied and broadly described herein, the invention provides a method for forming a planarized dielectric layer. The method comprises the steps of first dissolving hydrogen silsesquoxane (HSQ) in a solvent, then the solution is spread over the silicon substrate. Next, the solvent is allowed to evaporate, and then heated-treated using a temperature of about 150° C. to 400° C. to form a silica-coated dielectric layer. Finally, a fluoride implant treatment (FIT) is performed to create a dielectric layer having a better thermal stability, more stable dielectric constant and a lower leakage current.

It Is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates embodiments of the invention and, together with the description, serves to explain the principles of the invention. In the drawing, FIG. 1 is a graph with several curves showing the relationship of field strength versus leakage current density for a dielectric layer according to a conventional method and according to one preferred embodiment of this invention using a fluoride implant treatment; wherein,

Figure 1:
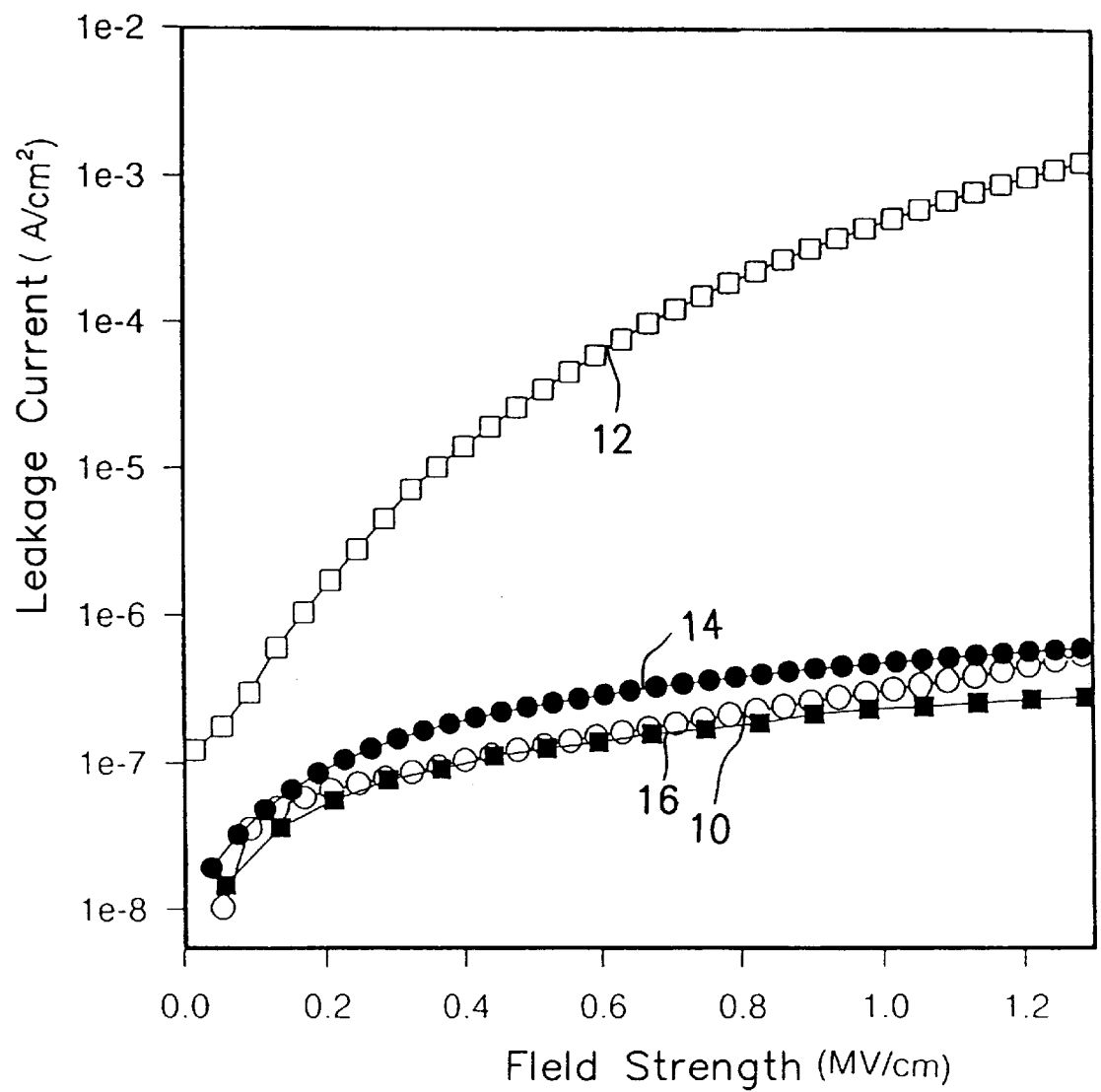

10: a graph of field strength versus leakage current density for a conventional dielectric layer without any fluoride implant treatment;

12: a graph of field strength versus leakage current density for a conventional dielectric layer without any fluoride implant treatment, but with heat treatment at 500° C. for about 30 minutes;

14: a graph of field strength versus leakage current density for a dielectric layer with a fluoride implant treatment; and

16: a graph of field strength versus leakage current density for a dielectric layer with a fluoride implant treatment and a high temperature annealing at 500° C. for about 30 minutes.

DESCRIPTION OF THE PREFERRED EMBODIMENTS

Reference will now be made in detail to the present preferred embodiments of the invention, examples of which are illustrated in the accompanying graph.

According to one preferred embodiment of this invention, the hydrogen silsesquioxane (HSQ) has the chemical formula of: $(HSi(OH)_xO_{3-x/2})_n$, where n is an integer bigger than 8, and x is between 0 to 2. In the following description, the hydrogen silsesquioxane is labeled as $FO_x$. The method of forming a planarized dielectric layer comprises the following steps:

1. The $FO_x$ is first dissolved in a solvent, for example, a methyl isobutyl ketone (MIBK), to form a $FO_x$ solution. The preferred concentration is 18% ($FO_x$15) or 22% ($FO_x$16) (where 15 and 16 are labels for representing the concentration of the two $FO_x$ solution). The $FO_x$ solution is then spread over a semiconductor substrate, for example, a silicon substrate.

2. The substrate is then heated to about 150° C. and maintained there for about one minute to let all the MIBK solvent to evaporate and the dielectric material HSQ to solidify. Then, the HSQ on the substrate is further heated to about 200° C. and maintained there for about one minute to melt the solidified dielectric layer. Next, more heat is added to increase the temperature to about 300° C. and maintained there for about one minute. This is to make the dielectric layer flow, thereby planarizing the dielectric and making the molecules inside the dielectric material to rebound again. Hence, an oxide film that resists cracking is formed. Finally, in an atmosphere of gaseous nitrogen, the substrate is further heat-treated at a temperature of about 400° C. for 30 to 60 minutes. The heat treatment is for transforming the original $FO_x$ into a three-dimensionally linked dielectric structure having a chemical formula of $(HSiO_{3/2})_n$.

3. The dielectric layer then undergoes a fluoride implant treatment, wherein an energy level of about 100 KeV and a dosage concentration of about $10^{15}$ to $5\times10^{15}$ is used, thereby completing the manufacture of the planarized dielectric layer. After a fluoride implant treatment, a more stable hydrogen-silicon bonding will be established inside the dielectric layer. Moreover, the dielectric constant and the leakage current will also have a better thermal stability.

Thermal stability of the dielectric material that has a fluoride implant treatment is compared with the one without such treatment in the following. The result is shown in table 1 below.

TABLE 1

| MATERIAL | DIELECTRIC CONSTANT |
|---|---|
| HSQ | 2.78 |
| HSQ (annealed at 500° C. for 30 minutes) | 5.9 |
| FIT HSQ | 3.3 |
| FIT HSQ (annealed at 500° C. for 30 minutes) | 3.31 |

In Table 1, HSQ is a dielectric layer formed by depositing hydrogen silsesquioxane in the conventional way, while FIT HSQ is a dielectric layer formed by depositing hydrogen silsesquioxane followed by a fluoride implant treatment. In general, the dielectric constant for silicon dioxide is between 3.9 to 4.0, and dielectric material having a dielectric constant smaller than 4.0 would be regarded as acceptable. By looking at Table 1, for a dielectric layer that has gone through 30 minutes of annealing at 500° C., its dielectric constant shoots up sharply from the original value of 2.78 to 5.9, which is outside the acceptable range. On the other hand, under the same condition, the dielectric layer that has been treated by a flouride implant only shoots up a little from 3.3 to 3.31, and so is more thermally stable.

FIG. 1 is a graph with several curves showing the relationship of field strength versus leakage current density for a dielectric layer according to a conventional method and according to one preferred embodiment of this invention using a fluoride implant treatment. As shown in FIG. 1, curve 10 (in hollow circles) shows a graph of field strength versus leakage current density for a conventional dielectric layer without any fluoride implant treatment, and curve 12 (in hollow squares) shows a graph of field strength versus leakage current density for a conventional dielectric layer without any fluoride implant treatment, but with heat treatment at 500° C. for about 30 minutes. A comparison of curve 10 with 12 will reveal that the leakage current density has increased enormously. Also shown in FIG. 1, curve 14 shown a graph of field strength versus leakage current density for a dielectric layer with a fluoride implant treatment, and curve 16 shows a graph of field strength versus leakage current density for a dielectric layer with a fluoride implant treatment and a high temperature annealing at 500° C. for about 30 minutes. A comparison of the curves 14 and 16 shows that the dielectric constant is thermally stable and there is very little variation of leakage current with respect to the field strength as well.

The characteristic of this invention is the addition of a fluoride implant treatment in the conventional method of forming a planarized dielectric layer. Consequently, the dielectric layer has better electrical properties such as a good thermal stability, a rather low dielectric constant and leakage current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a planarized dielectric layer over a semiconductor substrate, comprising:

dissolving hydrogen silsesquioxane in a solvent to form a solution, then spreading the solution over a semiconductor substrate;

heating to a first temperature to evaporate the solvent and then to solidify the hydrogen silsesquioxane;

further heating to a second temperature to melt the solidified hydrogen silsesquioxane;

further heating to a third temperature to planarize the melted hydrogen silsesquioxane forming an oxide layer;

further heating the oxide layer to a fourth temperature in an atmosphere of inert gas to form a planarized dielectric layer; and treating the dielectric layer by implanting fluorine ions into the planarized dielectric layer.

2. The method of claim 1, wherein the semiconductor substrate over which the dielectric layer is formed is a silicon substrate.

3. The method of claim 1, wherein the hydrogen silsesquioxane solution is formed by dissolving hydrogen silsesquioxane in a methyl isobutyl ketone solvent.

4. The method of claim 2, wherein the concentration level of hydrogen silsesquioxane in the solvent is about 18%.

5. The method of claim 2, wherein the concentration level of hydrogen silsesquioxane in the solvent is about 22%.

6. The method of claim 1, wherein the first temperature is about 150° C.

7. The method of claim 1, wherein the first temperature is maintained for about one minute.

8. The method of claim 1, wherein the second temperature is about 200° C.

9. The method of claim 1, wherein the second temperature is maintained for about one minute.

10. The method of claim 1, wherein the third temperature is about 300° C.

11. The method of claim 1, wherein the third temperature is maintained for about one minute.

12. The method of claim 1, wherein the fourth temperature is about 400° C.

13. The method of claim 1, wherein the inert gas used to surround the oxide layer for heat treatment is gaseous nitrogen.

14. The method of claim 1, wherein the dielectric layer is a hydrogen silicate compound $(HSiO_{3/2})_n$.

15. The method of claim 1, wherein the fourth temperature is maintained for about 30 to 60 minutes.

16. The method of claim 1, wherein the energy level used in the fluoride implant treatment is about 100 KeV.

17. The method of claim 16, wherein the dosage concentration level used in the fluoride implant treatment is about $10^{15}$ to $5 \times 10^{15}$.

18. A method for forming a planarized dielectric layer, comprising the steps of:

providing a semiconductor substrate;

spreading a hydrogen silsesquioxane solution over the substrate;

heating to a first temperature to planarize the hydrogen silsesquioxane solution and forming a first oxide layer;

further heating the oxide layer to a second temperature in an atmosphere of inert gas to form a dielectric layer; and treating the dielectric layer by implanting fluorine ions into the planarized dielectric layer.

19. The method of claim 18, wherein the semiconductor substrate is a silicon substrate.

20. The method of claim 18, wherein the hydrogen silsesquioxane solution is formed by dissolving hydrogen silsesquioxane in a methyl isobutyl ketone solvent.

21. The method of claim 20, wherein the concentration level of hydrogen silsesquioxane in the solvent is about 18%.

22. The method of claim 20, wherein the concentration level of hydrogen silsesquioxane in the solvent is about 22%.

23. The method of claim 18, wherein the first temperature is about 300° C.

24. The method of claim 18, wherein the first temperature is about 400° C.

25. The method of claim 18, wherein the step of forming the oxide layer includes first evaporating the solvent and solidifying the hydrogen silsesquioxane, then melting the solidified hydrogen silsesquioxane to achieve the planarization function.

26. The method of claim 18, wherein the inert gas used to surround the oxide layer for heat treatment is gaseous nitrogen.

27. The method of claim 18, wherein the dielectric layer is a hydrogen silicate compound $(HSiO_{3/2})_n$.

28. The method of claim 18, wherein the second temperature is maintained for about 30 to 60 minutes.

29. The method of claim 18, wherein the energy level used in the fluoride implant treatment is about 100 KeV.

30. The method of claim 29 wherein the dosage concentration level used in the fluoride implant treatment is about $10^{15}$ to $5\times10^{15}$.

* * * * *